US012812917B2

(12) United States Patent
Kwon et al.

(10) Patent No.: US 12,812,917 B2
(45) Date of Patent: Nov. 24, 2026

(54) TWO-DIMENSIONAL SEMICONDUCTOR TRANSISTOR DEVICE AND METHOD OF MANUFACTURING THE SAME

(71) Applicants: Samsung Electronics Co., Ltd., Suwon-si (KR); SEOUL NATIONAL UNIVERSITY R&DB FOUNDATION, Seoul (KR)

(72) Inventors: Junyoung Kwon, Suwon-si (KR); Gwanhyung Lee, Seoul (KR); Heeje Ryu, Seoul (KR)

(73) Assignees: Samsung Electronics Co., Ltd., Gyeonggi-do (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 255 days.

(21) Appl. No.: 18/591,799

(22) Filed: Feb. 29, 2024

(65) Prior Publication Data

US 2024/0304699 A1 Sep. 12, 2024

(30) Foreign Application Priority Data

Mar. 7, 2023 (KR) ........................ 10-2023-0030198

(51) Int. Cl.

| | |
|---|---|
| ***H10D 30/67*** | (2025.01) |
| ***H10D 64/00*** | (2025.01) |
| ***H10D 99/00*** | (2025.01) |
| *H10D 62/40* | (2025.01) |
| *H10D 62/80* | (2025.01) |

(52) U.S. Cl.

CPC ....... *H10D 30/6739* (2025.01); *H10D 30/673* (2025.01); *H10D 64/118* (2025.01); *H10D 99/00* (2025.01); *H10D 30/6734* (2025.01); *H10D 62/40* (2025.01); *H10D 62/80* (2025.01)

(58) Field of Classification Search

CPC .. H10D 30/6739; H10D 99/00; H10D 64/118; H10D 30/673

USPC .......................................................... 257/365

See application file for complete search history.

(56) References Cited

U.S. PATENT DOCUMENTS

| | | | |
|---|---|---|---|
| 7,968,674 | B2 | 6/2011 | Choi et al. |
| 7,988,941 | B2 | 8/2011 | Choi et al. |
| 8,133,466 | B2 | 3/2012 | Shin et al. |

(Continued)

FOREIGN PATENT DOCUMENTS

| | | | |
|---|---|---|---|
| KR | 10-2012-0118566 | A | 10/2012 |
| KR | 10-2082697 | B1 | 5/2020 |
| WO | 2018/009931 | A1 | 1/2018 |

OTHER PUBLICATIONS

Yu-Shu Lin et al., "Atomic layer deposition of sub-10 nm high-K gate dielectrics on top-gated MoS2 transistors without surface functionalization", Applied Surface Science 443, pp. 421-428, Feb. 27, 2018.

*Primary Examiner* — Jami Valentine Miller

(74) *Attorney, Agent, or Firm* — Harness, Dickey & Pierce, P.L.C.

(57) ABSTRACT

A semiconductor device includes a semiconductor layer including a two-dimensional semiconductor material, a source electrode and a drain electrode electrically connected to respective edge regions on the semiconductor layer, an insulating layer arranged on the semiconductor layer, and a gate electrode arranged on the insulating layer, wherein the insulating layer may include a single-crystal layer.

18 Claims, 15 Drawing Sheets

(56) References Cited

U.S. PATENT DOCUMENTS

| | | | | |
|---|---|---|---|---|
| 8,283,038 | B2 | 10/2012 | Choi et al. | |
| 8,535,553 | B2 | 9/2013 | Kong et al. | |
| 8,623,761 | B2 | 1/2014 | Bonilla et al. | |
| 8,723,024 | B2 | 5/2014 | Choi et al. | |
| 8,895,433 | B2 | 11/2014 | Bonilla et al. | |
| 8,906,787 | B2 | 12/2014 | Park et al. | |
| 8,912,530 | B2 | 12/2014 | Yang et al. | |
| 9,040,957 | B2 | 5/2015 | Lee et al. | |
| 9,064,777 | B2 | 6/2015 | Heo et al. | |
| 9,108,848 | B2 | 8/2015 | Woo et al. | |
| 9,324,634 | B2 | 4/2016 | Bao et al. | |
| 9,324,635 | B2 | 4/2016 | Bao et al. | |
| 9,359,211 | B2 | 6/2016 | Woo et al. | |
| 9,472,450 | B2 | 10/2016 | Bonilla et al. | |
| 9,527,043 | B2 | 12/2016 | Choi et al. | |
| 9,533,265 | B2 | 1/2017 | Choi et al. | |
| 9,583,358 | B2 | 2/2017 | Kim et al. | |
| 9,721,734 | B2 | 8/2017 | Ryu et al. | |
| 9,853,150 | B1 * | 12/2017 | Colinge | H10D 64/033 |
| 10,325,987 | B2 | 6/2019 | Park et al. | |
| 10,593,798 | B2 | 3/2020 | Tang et al. | |
| 2002/0086106 | A1 * | 7/2002 | Park | C23C 16/45544<br>427/248.1 |
| 2005/0084610 | A1 * | 4/2005 | Selitser | C23C 16/45519<br>427/248.1 |
| 2009/0058532 | A1 * | 3/2009 | Kikkawa | H03F 1/0288<br>330/295 |
| 2010/0078727 | A1 * | 4/2010 | Min | H10D 86/01<br>257/E21.616 |
| 2010/0244047 | A1 * | 9/2010 | Hull | H10D 30/635<br>257/77 |
| 2011/0089417 | A1 * | 4/2011 | Yamazaki | H10D 30/6755<br>257/43 |
| 2011/0127471 | A1 | 6/2011 | Shin et al. | |
| 2011/0175087 | A1 * | 7/2011 | Yamazaki | H10D 87/00<br>257/E27.06 |
| 2013/0049000 | A1 * | 2/2013 | Weng | H10D 30/6713<br>257/E27.06 |
| 2013/0059155 | A1 | 3/2013 | Choi et al. | |
| 2014/0087191 | A1 | 3/2014 | Chua et al. | |
| 2014/0141599 | A1 * | 5/2014 | Do | H10P 14/6308<br>438/478 |
| 2015/0123183 | A1 * | 5/2015 | Kato | H10B 10/125<br>257/314 |
| 2015/0235959 | A1 | 8/2015 | Lee et al. | |
| 2017/0309574 | A1 * | 10/2017 | Yamada | H10D 64/0114 |
| 2019/0165103 | A1 | 5/2019 | Lu et al. | |
| 2021/0296445 | A1 * | 9/2021 | Lee | H10D 62/121 |
| 2021/0327712 | A1 * | 10/2021 | Olsson | H10D 30/6211 |
| 2022/0140126 | A1 * | 5/2022 | LaRoche | H10D 30/475<br>257/183 |
| 2023/0143918 | A1 * | 5/2023 | Atanackovic | H10D 64/691<br>257/234 |
| 2023/0231029 | A1 * | 7/2023 | Rajashekhar | H10D 64/689<br>257/295 |
| 2023/0232634 | A1 * | 7/2023 | Rajashekhar | H10B 51/20<br>257/295 |
| 2023/0420250 | A1 * | 12/2023 | Lin | H10D 62/882 |
| 2024/0274434 | A1 * | 8/2024 | Nishihara | H10P 14/2904 |
| 2026/0082649 | A1 * | 3/2026 | Enokizono | H10D 62/60 |

* cited by examiner

TWO-DIMENSIONAL SEMICONDUCTOR TRANSISTOR DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2023-0030198, filed on Mar. 7, 2023, in the Korean Intellectual Property Office, the disclosure of which is incorporated by reference herein in its entirety.

BACKGROUND

1. Field

The disclosure relates to a semiconductor device and a method of manufacturing the same.

2. Description of the Related Art

As miniaturization for improving the degree of integration of semiconductor devices progresses, performance limitations due to scaling of 3D bulk materials are emerging. To overcome these limitations, research on two-dimensional semiconductor material-based semiconductor devices is in progress.

In general, a high-k oxide, which has high permittivity and is used as an insulating film in a high-performance transistor, is deposited through atomic layer deposition (ALD). However, it is difficult to deposit other materials on the surface of a two-dimensional material with consistency and/or high quality, and this issue has been especially observed in techniques such as ALD. Accordingly, technologies for facilitating ALD on the surface of a two-dimensional material have been developed.

SUMMARY

Provided are a semiconductor device including a high-quality insulating layer formed on a two-dimensional material, and a method of manufacturing the semiconductor device.

Additional aspects will be set forth in part in the description which follows and, in part, will be apparent from the description, or may be learned by practice of the presented embodiments of the disclosure.

According to an aspect of the disclosure, a semiconductor device includes a semiconductor layer including a semiconductor layer comprising a two-dimensional semiconductor material; a source electrode and a drain electrode electrically connected to respective edge regions of the semiconductor layer; gate electrode on the semiconductor layer; and an insulating layer between the semiconductor layer and the gate electrode, the insulating layer comprising a single-crystal layer.

The insulating layer may be lattice-matched with the two-dimensional semiconductor material of the semiconductor layer.

The insulating layer may have the same crystal orientation as the semiconductor layer.

The insulating layer may include $Sb_2O_3$ or $MoO_x$.

A thickness of the insulating layer may be greater than or equal to about 1 nm and less than or equal to about 5 nm.

The semiconductor layer may include at least one $MoS_2$, $MoSe_2$, $MoTe_2$, $WS_2$, $WSe_2$, $MoTe_2$, or $PtSe_2$.

The semiconductor device may further include a high-k dielectric layer between the insulating layer and the gate electrode.

The high-k dielectric layer may include a material having a higher permittivity than that of the insulating layer.

The high-k dielectric layer may include at least one of $HfO_2$ or $ZrO_2$.

The semiconductor device may include a field-effect transistor.

According to another aspect of the disclosure, a semiconductor device includes an electrode layer comprising a two-dimensional conductive material; a semiconductor layer comprising a two-dimensional semiconductor material; a first insulating layer between the electrode layer and the semiconductor layer, the first insulating layer comprising a single-crystal layer; and a source electrode and a drain electrode electrically connected to respective edge regions of the semiconductor layer.

The first insulating layer may be lattice-matched with the two-dimensional conductive material of the electrode layer.

The first insulating layer may have the same crystal orientation as the electrode layer.

The first insulating layer may include $Sb_2O_3$ or $MoO_x$.

A thickness of the first insulating layer may be greater than or equal to about 1 nm and less than or equal to about 5 nm.

The electrode layer may include at least one of graphene, $NbSe_2$, $NbS_2$, $TiS_2$, $TiSe_2$, $VS_2$, $VSe_2$, or $WTe_2$.

The semiconductor layer may include at least one of $MoS_2$, $MoSe_2$, $MoTe_2$, $WS_2$, $WSe_2$, $MoTe_2$, or $PtSe_2$.

The semiconductor device may further include a second insulating layer arranged on the semiconductor layer, and a gate electrode arranged on the second insulating layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
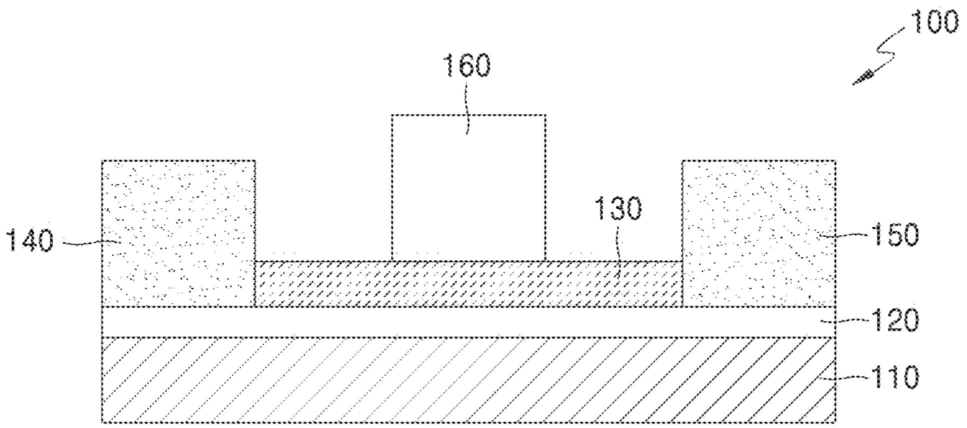
FIG. 1 is a cross-sectional view of a semiconductor device according to at least one embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

A semiconductor device and a method of manufacturing the same will now be described more fully with reference to the accompanying drawings. In the drawings, like reference numerals refer to like elements throughout and sizes of constituent elements may be exaggerated for convenience of explanation and the clarity of the specification. In the following drawings, the size of each component in the drawings may be exaggerated for clarity and convenience of description. In addition, the embodiments described below are an example only, and can be subjected to various modifications. Additionally, when the terms "about" or "substantially" are used in this specification in connection with a numerical value and/or geometric terms, it is intended that the associated numerical value includes a manufacturing tolerance (e.g., ±10%) around the stated value and/or term, unless indicated otherwise. Further, regardless of whether numerical values and/or geometric terms are modified as "about" or "substantially," it will be understood that these values should be construed as including a manufacturing or operational tolerance (e.g., ±10%) around the stated numerical values and/or geometry. When referring to "within" and/or "C to D", this means C inclusive to D inclusive unless otherwise specified. Also, embodiments described herein may have different forms and should not be construed as being limited to the descriptions set forth herein.

It will also be understood that when an element is referred to as being "on" or "above" another element, the element may be in direct contact with the other element or other intervening elements may be present. It will also be understood that spatially relative terms, such as "above", "top", etc., are intended to encompass different orientations of the device in use or operation in addition to the orientation depicted in the figures, and that the device may be otherwise oriented (rotated 90 degrees or at other orientations) and the spatially relative terms used herein interpreted accordingly. The singular forms include the plural forms unless the context clearly indicates otherwise. It should be understood that, when a part "comprises" or "includes" an element, unless otherwise defined, other elements are not excluded from the part and the part may further include other elements.

The use of the terms "a" and "an" and "the" and similar referents are to be construed to cover both the singular and the plural. The steps of all methods described herein can be performed in any suitable order unless otherwise indicated herein or otherwise clearly contradicted by context, and are not limited to the described order.

Functional elements, including elements that process at least one function or operation, may be implemented as processing circuitry such as hardware, software, or a combination of hardware and software, unless expressly indicated otherwise. For example, the processing circuitry more specifically may include, but is not limited to, electrical components such as at least one of transistors, resistors, capacitors, etc., and/or electronic circuits including said components, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. Furthermore, the connecting lines, or connectors illustrated in the various figures presented are intended to represent exemplary functional relationships and/or physical or logical couplings between the various elements. It should be noted that many alternative or additional functional relationships, physical connections or logical connections may be present in a practical device.

The use of any and all examples, or exemplary language (e.g., "such as") provided herein, is intended merely to better illuminate the disclosure and does not pose a limitation on the scope of the disclosure unless otherwise claimed.

FIG. 1 is a cross-sectional view of a semiconductor device according to at least one embodiment.

Referring to FIG. 1, a semiconductor device 100 may include a substrate 110, a semiconductor layer 120 arranged on the substrate 110, a source electrode 140 and a drain electrode 150 arranged at respective edge regions on the semiconductor layer 120, an insulating layer 130 arranged on the semiconductor layer 120 between the source electrode 140 and the drain electrode 150, and a gate electrode 160 arranged on the insulating layer 130.

In at least some examples, the substrate 110 may include a semiconductor material. For example, the substrate 110 may include an elemental and/or a compound semiconductor substrate. The substrate 110 may include, for example, silicon (Si), germanium (Ge), silicon germanium (SiGe), silicon carbide (SiC), gallium arsenide (GaAs), indium arsenide (InAs), indium phosphide (InP), etc. In addition, the substrate 110 may further include an insulating material such as oxide, silicon nitride, silicon oxynitride, etc. The substrate 110 may be doped with a P-type dopant or an N-type dopant. The substrate 110 may be a substrate for growth of the semiconductor layer 120.

The semiconductor layer 120 includes a two-dimensional (2D) semiconductor material. For example, the semiconductor layer 120 may include, for example, a transition metal dichalcogenide (TMD). The semiconductor layer 120 may include, for example, at least one of $MoS_2$, $MoSe_2$, $MoTe_2$, $WS_2$, $WSe_2$, $MoTe_2$, or $PtSe_2$. The semiconductor layer 120 may be a single layer or a multilayer (when several single layers are stacked). The semiconductor layer 120 may act as a channel layer of the semiconductor device 100. The semiconductor layer 120 may include a sheet of the two-dimensional material and/or a stack including a plurality of sheets, such that the two-dimensional lattice of the two-dimensional material extends parallel (or substantially parallel) to an upper surface of the substrate 110.

The insulating layer 130 may be provided on the semiconductor layer 120. The insulating layer 130 may be formed on the semiconductor layer 120 through epitaxial growth, as described in further detail below. The insulating layer 130 formed through epitaxial growth may be lattice-matched with the semiconductor layer 120. For example, the insulating layer 130 formed through epitaxial growth may have the same crystal orientation as the semiconductor layer 120. By using epitaxial growth, a material having a high permittivity may be deposited on the semiconductor layer 120.

The insulating layer 130 may include a material having a higher permittivity than that of silicon oxide. The insulating layer 130 may have a permittivity higher than that of hexagonal boron nitride (h-BN). The insulating layer 130 may include, for example, $Sb_2O_3$ or $MoO_x$, but is not limited thereto, and may include an insulating material that may be formed on the semiconductor layer 120 through epitaxial growth.

The insulating layer 130 may be a single-crystal layer. A single-crystal structure applied to the insulating layer 130 may be advantageous in leakage current characteristics. The semiconductor device 100 according to the embodiment includes the insulating layer 130 that has a single-crystal structure in which an insulating material is epitaxially grown on a two-dimensional semiconductor material, and therefore lacks internal grain boundaries. In contrast, a poly-crystal structure is not suitable for use in a gate insulating layer because grain boundaries of the poly-crystal structure may be used as passages for a leakage current; however, it is generally known that making an insulating layer with a single-crystal structure is highly difficult. Thus, high-k materials having an amorphous structure have been generally preferred as insulating materials. However, it is difficult to directly grow the high-k materials on a two-dimensional semiconductor material. The insulating layer 130 may act as a gate insulating film with low leakage current. When the insulating layer 130 is grown as a single-crystal layer, the process of forming a seed layer in order to form a high-k material on a two-dimensional material according to the related art is not required, and thus the thickness of the insulating layer 130 may be reduced. The thickness of the insulating layer 130 may be, for example, greater than or equal to about 1 nm and less than or equal to about 5 nm. The thickness of the insulating layer 130 may be, for example, greater than or equal to 2 nm or and less than or equal to about 3 nm. In addition, since single-crystals have a relatively high permittivity, a high permittivity may be exhibited even with a small thickness, and thus, when the insulating layer 130 is deposited as a single-crystal layer, equivalent oxide thickness (EOT) scaling may be improved. The permittivity of the insulating layer 130 may be greater than 3.6, for example. The permittivity of the insulating layer 130 may be greater than 10, for example. The permittivity of the insulating layer 130 may be greater than 13, for example.

The source electrode 140 and the drain electrode 150 are provided on respective edge regions on the semiconductor layer 120, respectively. The source electrode 140 and the drain electrode 150 may be electrically connected to the edge regions of the semiconductor layer 120, respectively. The source electrode 140 and the drain electrode 150 may have various structures such as a raised structure or a recessed structure. The source electrode 140 and the drain electrode 150 may include a metal and/or a metallically conductive material. The source electrode 140 and the drain electrode 150 may include, for example, a metal material having excellent electrical conductivity, such as Ag, Au, Pt, Cu, etc.

The gate electrode 160 may be referred to as an upper gate. The gate electrode 160 may include a metal material and/or a conductive oxide. The metal material may include, for example, Au, Ti, TiN, TaN, W, Mo, WN, Pt, Ni, and/or a combination thereof. The conductive oxide may include, for example, indium tin oxide (ITO), indium zinc oxide (IZO), and/or the like. However, the above are only examples.

Figure 2:
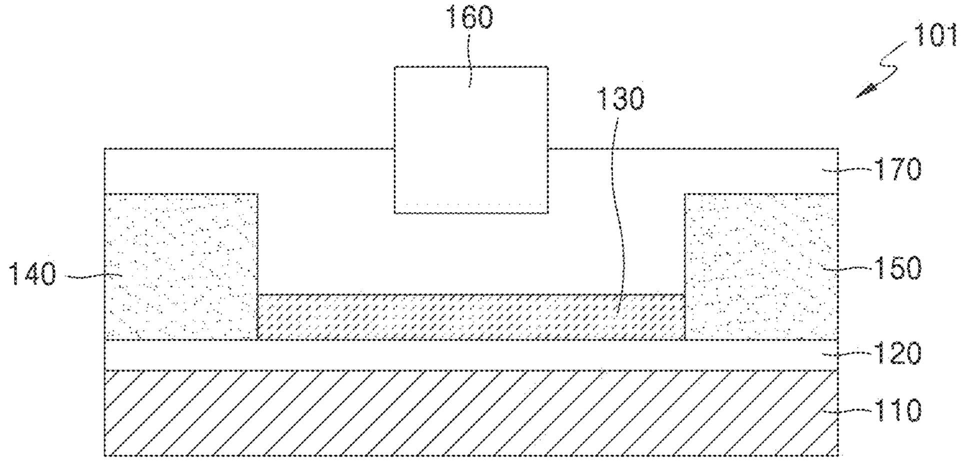
FIG. 2 is a cross-sectional view of a semiconductor device according to at least one embodiment.

FIG. 2 is a cross-sectional view of a semiconductor device according to at least one embodiment.

Referring to FIG. 2, a semiconductor device 101 may include the substrate 110, the semiconductor layer 120 arranged on the substrate 110, the source electrode 140 and the drain electrode 150 that are respectively electrically connected to respective edge regions on the semiconductor layer 120, the insulating layer 130 arranged on the semiconductor layer 120 between the source electrode 140 and the drain electrode 150, the gate electrode 160 arranged on the insulating layer 130, and a high-k dielectric layer 170 between the insulating layer 130 and the gate electrode 160.

The semiconductor device 101 of FIG. 2 may be the same as the semiconductor device 100 of FIG. 1 except that the high-k dielectric layer 170 is further included. Therefore, in describing the embodiment of FIG. 2, repeated description of details provided with reference to FIG. 1 will be omitted.

The high-k dielectric layer 170 may include a material having a higher permittivity than that of the insulating layer 130. The permittivity of the material constituting the high-k dielectric layer 170 may be greater than 13.1, for example. The high-k dielectric layer 170 may include a metal oxide formed by a suitable method such as metal organic chemical vapor deposition (MOCVD), physical vapor deposition (PVD), atomic layer deposition (ALD), molecular beam epitaxy (MBE), and/or the like. The high-k dielectric layer 170 may include a bulk (or three-dimensional) insulator, for example, $HfO_2$ or $ZrO_2$. The insulating layer 130 may act as an interlayer under the high-k dielectric layer 170, and in this case, the thickness of the insulating layer 130 may be, for example, greater than or equal to about 1 nm and less than or equal to about 2 nm. Since the high-k dielectric layer 170 has a relatively high permittivity and the insulating layer 130 having a high permittivity act as an intermediate layer in deposition, EOT scaling of the semiconductor device 101 may be further improved.

Figure 3:
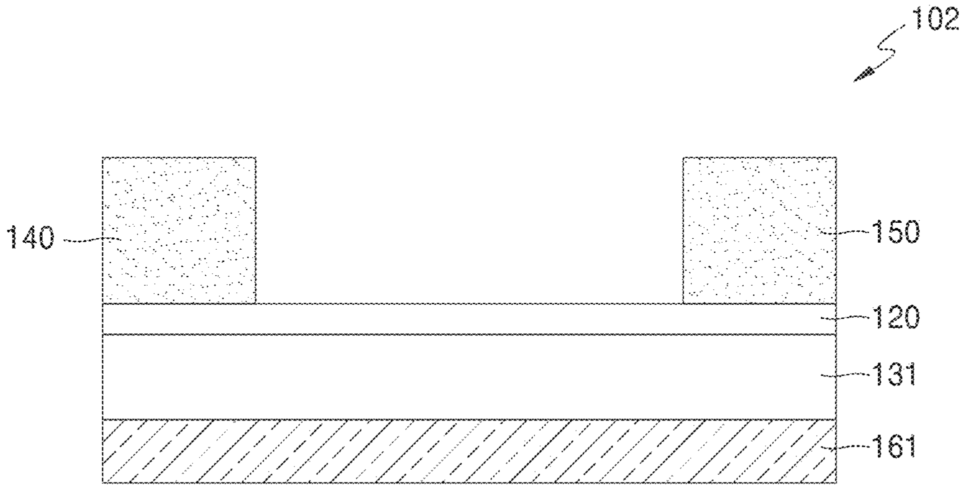
FIG. 3 is a cross-sectional view of a semiconductor device according to at least one embodiment.

FIG. 3 is a cross-sectional view of a semiconductor device according to at least one embodiment.

Referring to FIG. 3, a semiconductor device 102 may include an electrode layer 161, an insulating layer 131 arranged on the electrode layer 161, the semiconductor layer 120 arranged on the insulating layer 131, and the source electrode 140 and the drain electrode 150 respectively electrically connected to respective edge regions on the semiconductor layer 120. The semiconductor layer 120, the source electrode 140, and the drain electrode 150 may be the same as the semiconductor layer 120, the source electrode 140, and the drain electrode 150 of FIG. 1, respectively. Therefore, in describing the embodiment of FIG. 3, repeated description of details provided with reference to FIG. 1 will be omitted.

The electrode layer 161 acts as a gate electrode. The electrode layer 161 may be referred to as a lower gate. In at least one embodiment, the electrode layer 161 may include a two-dimensional metal material (or a two-dimensional conductive material). For example, the electrode layer 161 may include graphene $NbSe_2$, $NbS_2$, $TiS_2$, $TiSe_2$, $VS_2$, $VSe_2$, and $WTe_2$. However, the examples are not limited thereto.

The insulating layer 131 may be provided on the electrode layer 161. The insulating layer 131 corresponds to the insulating layer 130 described above, and therefore may include the materials given as examples as those of the insulating layer 130 described above. For example, the insulating layer 131 may include $Sb_2O_3$ which is lattice-matched with graphene, and this way, ensures epitaxial single-crystalline growth of the insulating layer 131 on the electrode layer 161 that includes the two-dimensional material. The insulating layer 131 may be formed on the electrode layer 161 through epitaxial growth. The insulating layer 131 formed through epitaxial growth may have the same (or substantially similar) crystal orientation as the electrode layer 161. Therefore, the insulating layer 131 may be deposited on the electrode layer 161 to prevent surface roughness scattering according to surface roughness of the electrode layer 161. The insulating layer 131 may be deposited on the electrode layer 161 to provide a flat platform for the semiconductor layer 120 arranged on the electrode layer 161.

The insulating layer 131 may be a single-crystal layer. By growing the insulating layer 131 as a single-crystal layer, there is no need to form an interlayer, and accordingly, the thickness of the insulating layer 131 may be reduced. The thickness of the insulating layer 131 may be, for example, greater than or equal to about 1 nm and less than or equal to about 5 nm. The thickness of the insulating layer 131 may be, for example, greater than or equal to about 2 nm and equal to or less than about 3 nm. In addition, since single-crystals have a relatively high permittivity, a high permittivity may be exhibited even with a small thickness, and thus, when the insulating layer 131 is deposited as a single-crystal layer, EOT scaling may be improved.

According to the semiconductor device 102 of the present examples, a layer-structured material is formed on a two-dimensional metal material using an epitaxial growth method. As such, a gate stack (a gate electrode and a gate insulating layer) may provide an atomically flat platform, for forming a semiconductor channel including a two-dimensional semiconductor material and/or a reduced thickness.

Figure 4:
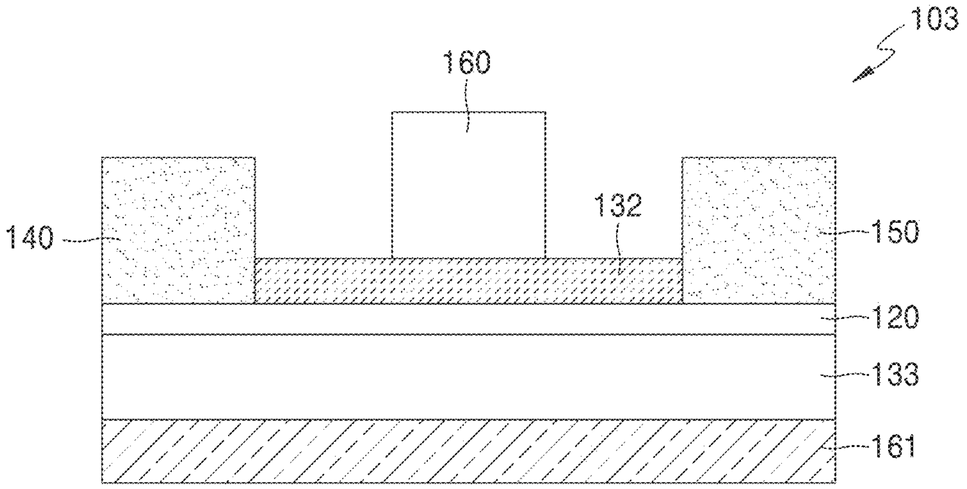
FIG. 4 is a cross-sectional view of a semiconductor device according to at least one embodiment.

FIG. 4 is a cross-sectional view of a semiconductor device according to at least one embodiment.

Referring to FIG. 4, a semiconductor device 103 may include the electrode layer 161, a first insulating layer 133 disposed on the electrode layer 161, the semiconductor layer 120 disposed on the first insulating layer 133, the source electrode 140 and the drain electrode 150 respectively electrically connected to both edge regions of the semiconductor layer 120, a second insulating layer 132 arranged on the semiconductor layer 120 between the source electrode 140 and the drain electrode 150, and the gate electrode 160 arranged on the second insulating layer 132. The semiconductor layer 120, the second insulating layer 132, the source electrode 140, the drain electrode 150, and the gate electrode 160 may be the same as the semiconductor layer 120, the insulating layer 130, the source electrode 140, the drain electrode 150, and the gate electrode 160 of FIG. 1, respectively, and the first insulating layer 133 and the electrode layer 161 may be the same as the insulating layer 131 and the electrode layer 161 of FIG. 3, respectively. In the description of the embodiment of FIG. 4, repeated description of details provided with reference to FIGS. 1 and 3 will be omitted.

The semiconductor device 103 may have a dual gate structure. The electrode layer 161 may act as a lower gate of the semiconductor device 103, and the gate electrode 160 may act as an upper gate of the semiconductor device 103. The semiconductor device 103 may exhibit improved device performance by simultaneously including the upper and lower gates.

The semiconductor devices 100, 101, 102, and 103 illustrated in FIGS. 1 to 4 may be referred to, for example, as field-effect transistors (FETs).

FIGS. 5A to 5E are diagrams illustrating a method of manufacturing a semiconductor device, according to at least one embodiment.

Figure 5A:
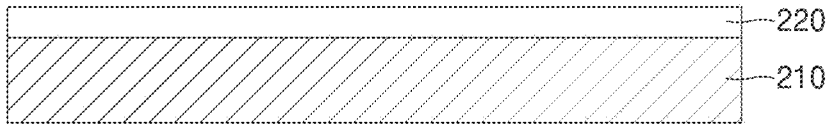
FIGS. 5A to 5E are diagrams illustrating a method of manufacturing a semiconductor device, according to at least one embodiment.

Referring to FIG. 5A, a semiconductor layer 220 is formed on a substrate 210. The semiconductor layer 220 may include a two-dimensional semiconductor material, such as, for example, TMD.

Figure 5B:
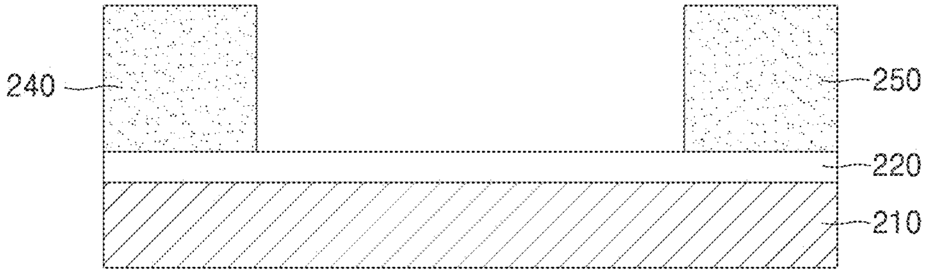

Referring to FIG. 5B, a source electrode 240 and a drain electrode 250 are formed on the respective edge regions of the semiconductor layer 220. The source electrode 240 and the drain electrode 250 may be formed by physical vapor deposition (PVD), ion implantation, and/or diffusion, but are not limited thereto.

Figure 5C:
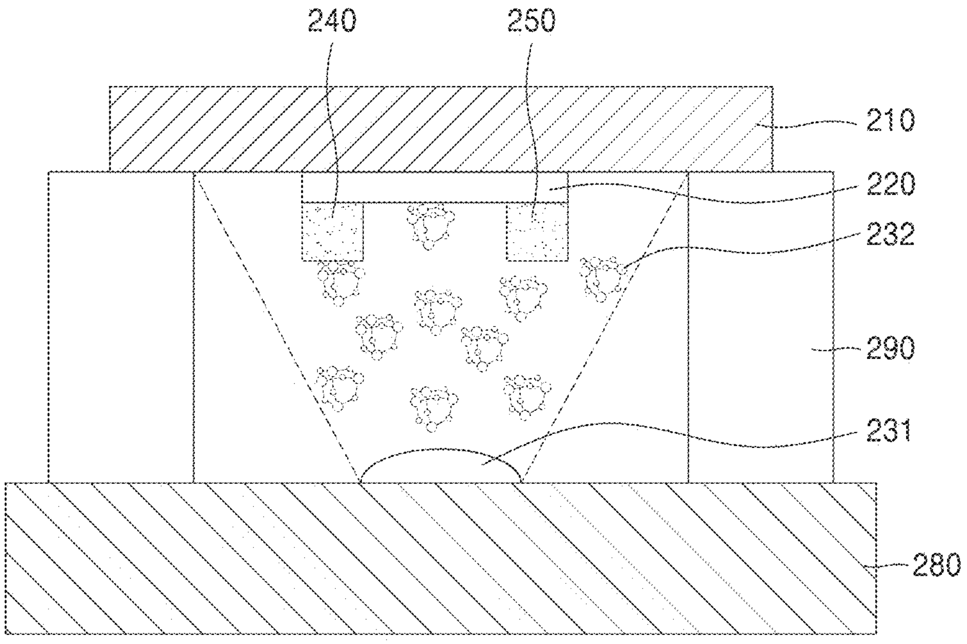

Referring to FIG. 5C, the substrate 210 is arranged upside down using a suspender 290. A target material 231 and the substrate 210 are heated using a heating plate 280 to deposit an evaporated target material 232, on a surface of the semiconductor layer 220 between the source electrode 240 and the drain electrode 250. The heating and/or the rate of evaporation is controlled to promote crystal growth over nucleation. For example, in at least one example, the temperature of the heated substrate 210 here is 150° C. or higher. The target material 231 may include, for example, antimony trioxide ($Sb_2O_3$) or molybdenum oxide ($MoO_x$, wherein x may be 2 to 3).

Figure 5D:
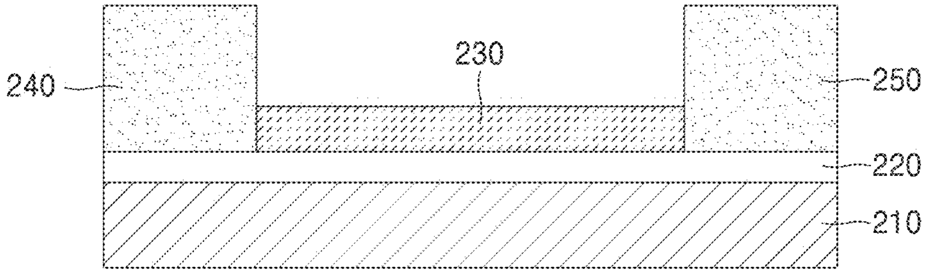

Referring to FIG. 5D, the insulating layer 230 is formed by depositing the target material 231 on the surface of the semiconductor layer 220. The insulating layer 230 may be formed on the surface of the semiconductor layer 220 through epitaxial growth. The insulating layer 230 may be a single-crystal layer. The insulating layer 230 may be lattice-matched with the semiconductor layer 220. The insulating layer 230 may have the same crystal orientation as that of the semiconductor layer 220. However, the disclosure is not limited thereto, and the insulating layer 230 may be formed, for example, by an ALD method in which a precursor is oxidized in an oxygen, water, ozone, or plasma atmosphere. The insulating layer 230 may be formed by a direct deposition method using a thermal evaporation method or an electron beam evaporation method.

Figure 5E:
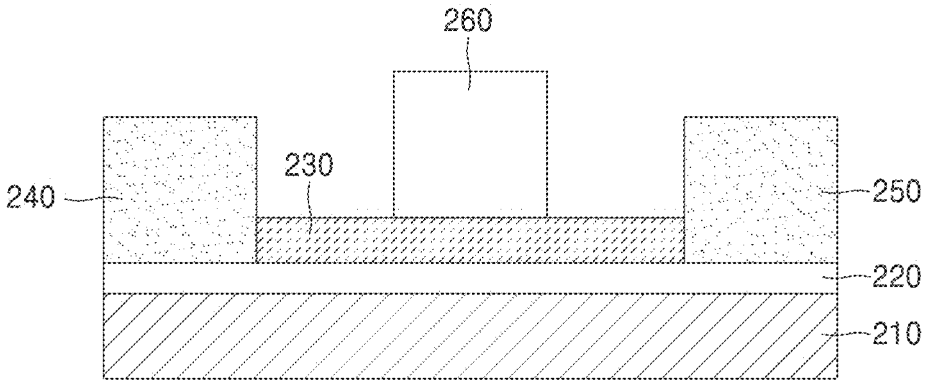

Referring to FIG. 5E, a gate electrode 260 is formed on the insulating layer 230. The gate electrode 260 may be referred to as an upper gate. The gate electrode 260 may include a metal material or a conductive oxide.

Figure 6:
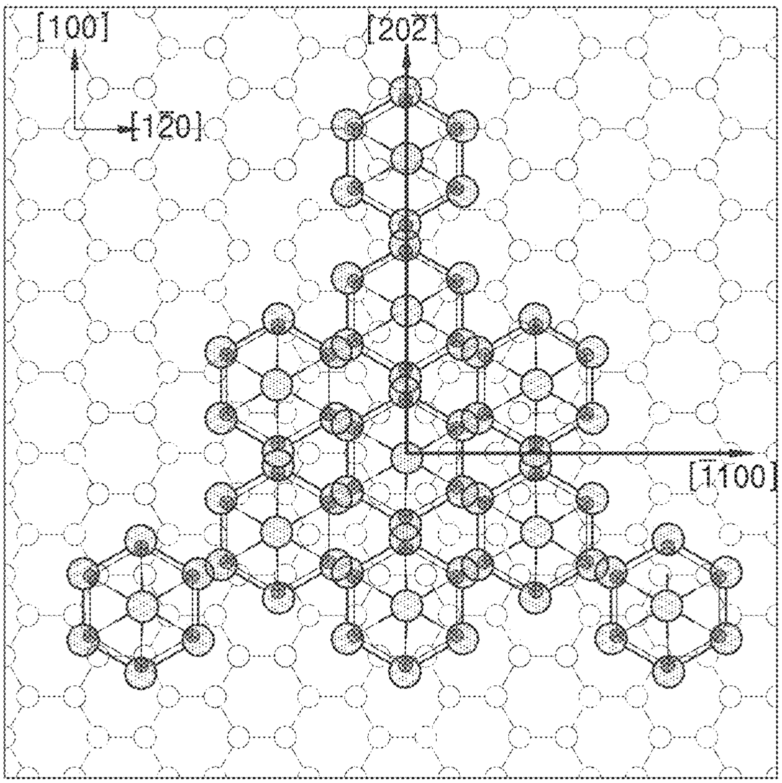
FIG. 6 is a diagram illustrating an example of crystal orientation of a metal layer and an insulating layer, according to at least one embodiment.

FIG. 6 is a diagram illustrating an example of a crystal orientation of a metal layer and an insulating layer, according to at least one embodiment.

Referring to FIG. 6, a crystal orientation when an $Sb_2O_3$ insulating layer is deposited on a graphene gate electrode through epitaxial growth is shown. Through epitaxial growth, the $Sb_2O_3$ insulating layer is grown with directionality, on the graphene gate electrode, and here, it is shown that growth occurs such that the [100] direction of graphene corresponds to the $[20\bar{2}]$ direction of $Sb_2O_3$. In these cases, $Sb_2O_3$ is grown as single-crystals on graphene.

Figure 7:
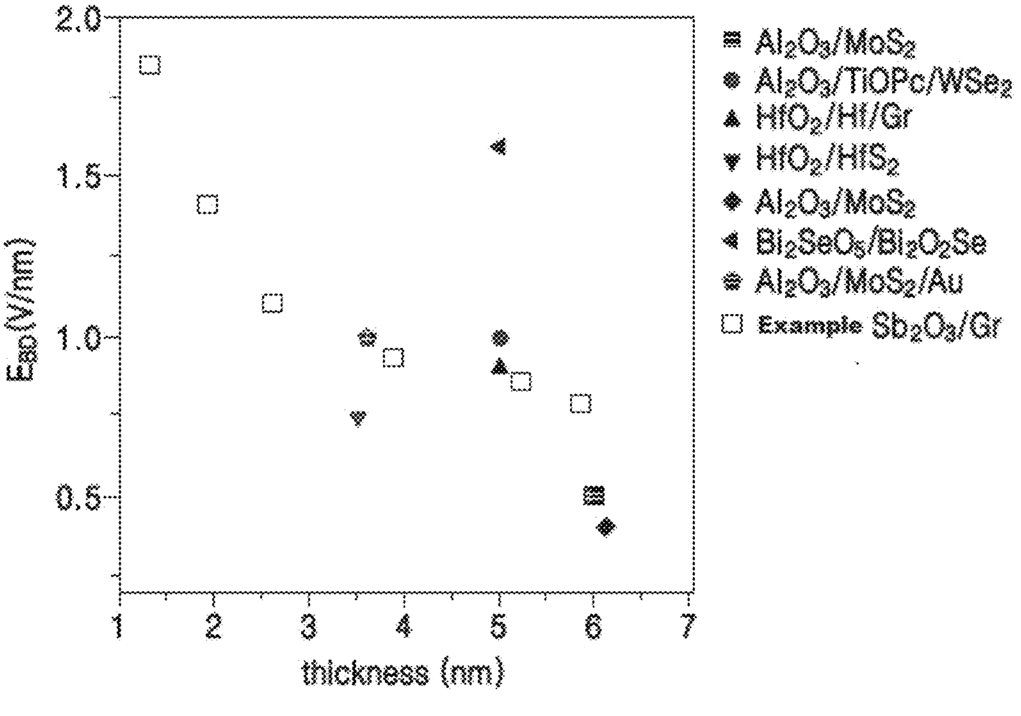
FIG. 7 is a graph showing a value of an electric field according to a thickness of an insulating layer.

FIG. 7 is a graph showing a value of an electric field according to a thickness of an insulating layer. FIG. 7 is a graph showing an electric field measured using the semiconductor device 102 of FIG. 3, which including a graphene lower gate and a $Sb_2O_3$ insulating layer.

Referring to FIG. 7, the aspect of a breakdown electric field ($E_{BD}$) according to the thickness of the $Sb_2O_3$ insulating layer is shown. $E_{BD}$ refers to the strength of an electric field that exceeds the dielectric strength of a material and causes dielectric breakdown.

Unlike other deposited thin films, the example $Sb_2O_3$ insulating layer grown on graphene (example $Sb_2O_3$/Gr) exhibits improved crystallinity as the thickness thereof becomes thinner. Since the $Sb_2O_3$ insulating layer tends to have a higher $E_{BD}$ as the thickness thereof decreases, and also has a strong $E_{BD}$ even at a thickness of 1 nm, EOT scaling may be improved by depositing an insulating layer including $Sb_2O_3$.

Figure 8:
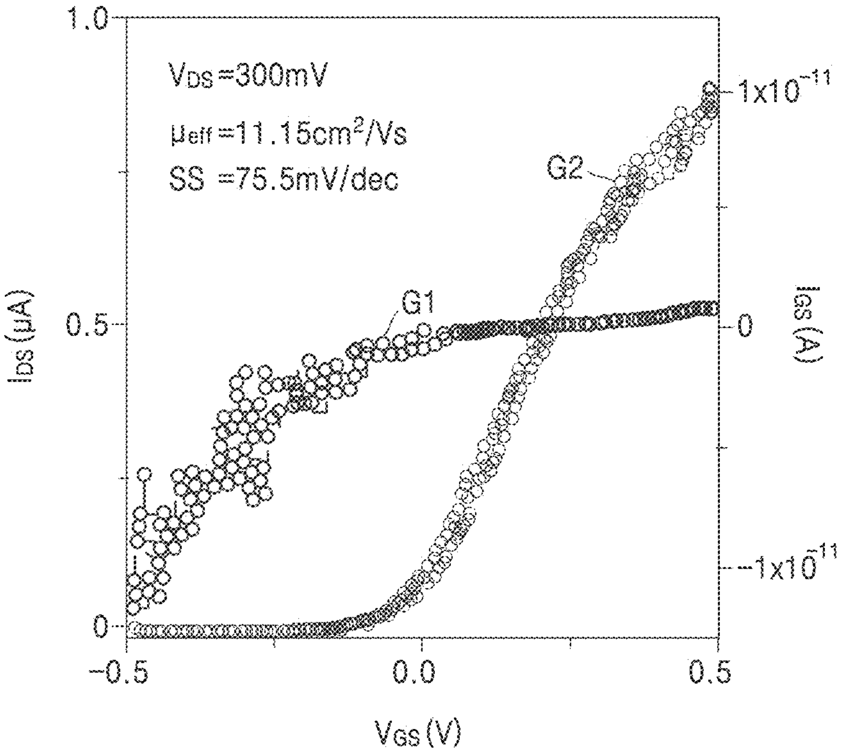
FIG. 8 is a graph showing the characteristics of a semiconductor device according to at least one embodiment.

FIG. 8 is a graph showing the characteristics of a semiconductor device according to at least one embodiment. FIG. 8 is a graph showing an electric field measured using the semiconductor device 102 of FIG. 3 including a graphene lower gate and a $Sb_2O_3$ insulating layer.

The semiconductor device of FIG. 8 is a FET.

Referring to FIG. 8, a first graph G1 representing a gate leakage current of a semiconductor device and a second graph G2 representing a transfer curve of the semiconductor device are shown.

Referring to G1 of FIG. 8, due to the high permittivity characteristics of the $Sb_2O_3$ insulating layer, a gate leakage current value of the semiconductor device has a low value of less than 10E-11 A and a low subthreshold swing (SS) value of 75 mV/dec. SS refers to a voltage value required to increase a current value by ten times. That is, the lower the SS value, a smaller voltage is required to obtain a desired current, and accordingly, required power consumption is also reduced.

Referring to G2 of FIG. 8, a gate voltage-drain current transfer curve of a semiconductor device including a $Sb_2O_3$ insulating layer is shown. The minute difference in a value between a reverse sweep and a forward sweep indicates that excellent device characteristics without hysteresis are achieved.

Accordingly, it may be confirmed that a high-performance FET may be obtained by using $Sb_2O_3$ insulating layer.

Figure 9:
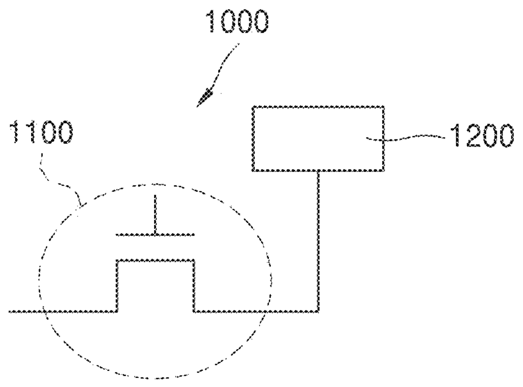
FIG. 9 is a diagram illustrating an electronic device according to at least one embodiment.

FIG. 9 is a diagram illustrating an electronic device according to at least one embodiment.

Referring to FIG. 9, an electronic device 1000 may include a switching element 1100 and a data storage unit 1200 connected thereto. The switching element 1100 may include a transistor. The switching element 1100 may include one of the semiconductor devices 100, 101, 102, and 103 according to the embodiments of FIGS. 1 to 4.

The data storage unit 1200 may include a data storage unit used in a volatile or non-volatile memory device. The data storage unit 1200 may include, for example, a capacitor, and/or may include a magnetoresistive layer, a phase change layer, and/or the like. The electronic device 1000 may be referred to as a memory device.

Next, electronic devices according to at least one embodiment is described. Electronic devices according to at least one embodiment may include the semiconductor device or electronic device described above.

Figure 10:
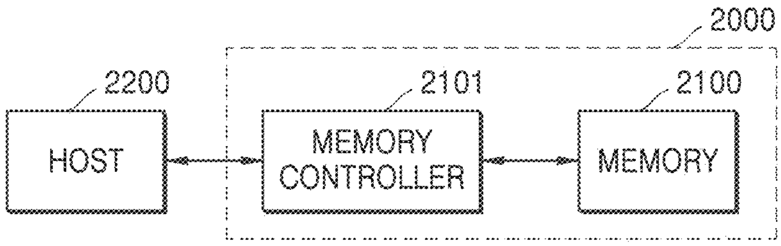
FIG. 10 is a diagram illustrating an electronic system as an electronic device according to at least one embodiment.

FIG. 10 is a diagram illustrating an electronic system as an electronic device according to at least one embodiment.

Referring to FIG. 10, an electronic system 2000 may include a memory 2100 and a memory controller 2101. The memory controller 2101 is configured to control the memory 2100 to read data from and/or write data to the memory 2100 in response to a request from the host 2200.

In at least one example, the memory 2100 includes the electronic device of FIG. 9. In at least one example, the memory 2100 and the memory controller 2101 of the electronic system 2000 includes a switching element, and the switching element may include at least one of the semiconductor devices 100, 101, 102, and 103 according to the embodiments of FIGS. 1 to 4.

Figure 11:
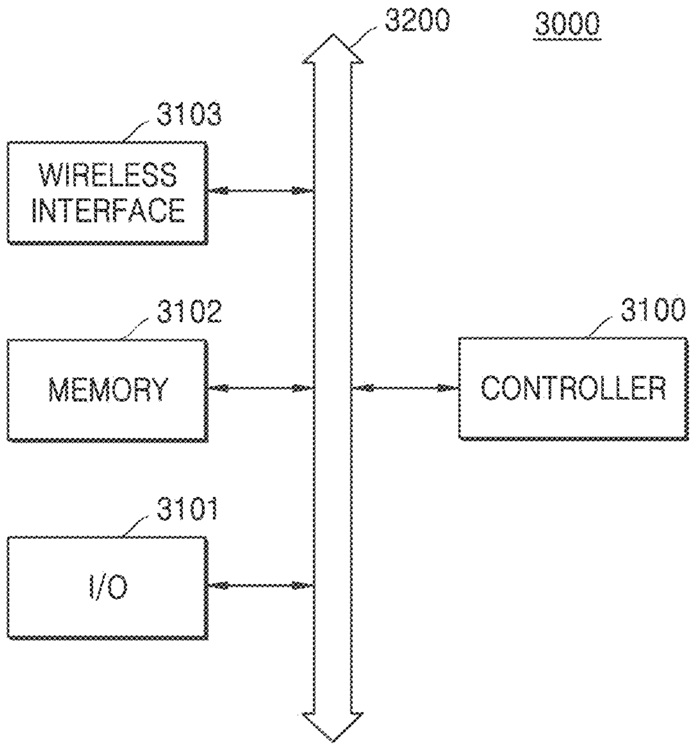
FIG. 11 is a diagram illustrating an electronic system as an electronic device according to at least one embodiment.

FIG. 11 is a diagram illustrating an electronic system as an electronic device according to at least one embodiment.

Referring to FIG. 11, an electronic system 3000 may configure a wireless communication device (or a device capable of transmitting and/or receiving information in a wireless environment). The electronic system 3000 may include a controller 3100, an input/output device (I/O) 3101, a memory 3102, and a wireless interface 3103, which are interconnected via a bus 3200, respectively.

The controller 3100 may include at least one of a microprocessor, a digital signal processor, or a processing device similar thereto. The input/output device 3101 may include at least one of a touch screen, keypad, keyboard, display, speaker, and/or the like.

The memory 3102 is configured to store instructions executed by the controller 3100. For example, the memory 3102 may be used to store user data. The memory 3102 may include the semiconductor device of FIG. 8.

The components included in the electronic system 3000, (e.g., the controller 3100, the input/output device (I/O) 3101, the memory 3102, and the wireless interface 3103), may include a switching element, and the switching element may include at least one of the semiconductor devices 100, 101, 102, and/or 103 according to the embodiments of FIGS. 1 to 4.

The electronic system 3000 may use the wireless interface 3103 to transmit/receive data over a wireless communication network. The wireless interface 3103 may include an antenna and/or a wireless transceiver. In some embodiments, the electronic system 3000 may be used in a communication interface protocol of a third generation communication system, for example, code division multiple access (CDMA), global system for mobile communications (GSM), north American digital cellular (NADC), extended-time division multiple access (E-TDMA), and/or wide band code division multiple access (WCDMA).

By epitaxially growing an insulating layer, the semiconductor device according to the disclosure may have improved performance even with a relatively small thickness.

The semiconductor device and the method of manufacturing the same have been described with reference to the embodiments shown in the drawings, but these are merely an example, and it will be understood by those skilled in the art that various modifications and equivalents thereto may be made. The disclosed embodiments should thus be considered in a descriptive sense only and not for purposes of limitation. The scope of the disclosure is defined not by the detailed description of the disclosure but by the appended claims, and all differences within the scope will be construed as being included in the scope of the disclosure.

According to the disclosed embodiments, the semiconductor device includes an insulating layer that is epitaxially grown on a two-dimensional material, and thus may have improved performance even with a relatively small thickness.

The semiconductor device described above may be used in memory devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:

a semiconductor layer comprising a two-dimensional semiconductor material;

a source electrode and a drain electrode electrically connected to respective edge regions of the semiconductor layer;

a gate electrode on the semiconductor layer; and an insulating layer between the semiconductor layer and the gate electrode, the insulating layer comprising a single-crystal layer, wherein the insulating layer is lattice-matched with the two-dimensional semiconductor material of the semiconductor layer.

2. The semiconductor device of claim 1, wherein the insulating layer comprises $Sb_2O_3$ or $MoO_x$.

3. The semiconductor device of claim 1, wherein a thickness of the insulating layer is greater than or equal to about 1 nm and less than or equal to about 5 nm.

4. The semiconductor device of claim 1, wherein the semiconductor layer comprises at least one of $MoS_2$, $MoSe_2$, $MoTe_2$, $WS_2$, $WSe_2$, or $PtSe_2$.

5. The semiconductor device of claim 1, further comprising:

a high-k dielectric layer between the insulating layer and the gate electrode.

6. The semiconductor device of claim 5, wherein the high-k dielectric layer comprises a material having a permittivity greater than a permittivity of the insulating layer.

7. The semiconductor device of claim 5, wherein the high-k dielectric layer comprises at least one of $HfO_2$ or $ZrO_2$.

8. The semiconductor device of claim 1, wherein the semiconductor device comprises a field-effect transistor.

9. A semiconductor device comprising:

an electrode layer comprising a two-dimensional conductive material;

a semiconductor layer comprising a two-dimensional semiconductor material;

a first insulating layer between the electrode layer and the semiconductor layer, the first insulating layer comprising a single-crystal layer; and a source electrode and a drain electrode electrically connected to respective edge regions of the semiconductor layer, wherein the first insulating layer has the same crystal orientation as the electrode layer.

10. The semiconductor device of claim 9, wherein the first insulating layer is lattice-matched with the two-dimensional conductive material of the electrode layer.

11. The semiconductor device of claim 9, wherein the first insulating layer comprises $Sb_2O_3$ or $MoO_x$.

12. The semiconductor device of claim 9, wherein a thickness of the first insulating layer is greater than or equal to about 1 nm and less than or equal to about 5 nm.

13. The semiconductor device of claim 9, wherein the electrode layer comprises at least one of graphene, $NbSe_2$, $NbS_2$, $TiS_2$, $TiSe_2$, $VS_2$, $VSe_2$, or $WTe_2$.

14. The semiconductor device of claim 10, wherein the semiconductor layer comprises at least one of $MoS_2$, $MoSe_2$, $MoTe_2$, $WS_2$, $WSe_2$, or $PtSe_2$.

15. The semiconductor device of claim 9, further comprising:

a second insulating layer on the semiconductor layer; and a gate electrode on the second insulating layer.

16. The semiconductor device of claim 15, wherein the second insulating layer comprises a single-crystal layer.

17. The semiconductor device of claim 15, wherein the second insulating layer comprises $Sb_2O_3$ or $MoO_x$.

18. The semiconductor device of claim 1, wherein the insulating layer has the same crystal orientation as the semiconductor layer.

* * * * *